United States Patent [19]

Shoquist et al.

[11] Patent Number: 5,297,025
[45] Date of Patent: Mar. 22, 1994

[54] POWER SUPPLY ASSEMBLY

[75] Inventors: William A. Shoquist, Prior Lake; Gregory A. Morey, Bloomington, both of Minn.

[73] Assignee: Onan Corporation, Minneapolis, Minn.

[21] Appl. No.: 967,445

[22] Filed: Oct. 28, 1992

[51] Int. Cl.⁵ ............................................. H05K 7/20
[52] U.S. Cl. .................................. 361/704; 307/150; 361/690; 361/736; 361/752
[58] Field of Search ............... 174/16.3; 307/150, 151; 363/141, 144–145; 361/383, 386–389, 391–392, 394–395, 412, 413, 415

[56] References Cited

U.S. PATENT DOCUMENTS

| | | |
|---|---|---|
| 3,303,392 | 2/1967 | Zelina . |
| 3,519,889 | 7/1970 | Monaco ............................. 361/388 |
| 3,992,653 | 11/1976 | Richardson et al. . |
| 4,060,847 | 11/1977 | Penrod . |
| 4,177,499 | 12/1979 | Volkmann . |
| 4,193,444 | 3/1980 | Boyd et al. . |
| 4,470,002 | 9/1984 | Brown ............................... 361/386 |
| 4,542,437 | 9/1985 | Ellis et al. ......................... 361/386 |
| 4,639,834 | 1/1987 | Mayer . |
| 4,707,726 | 11/1987 | Tinder . |
| 4,729,426 | 3/1988 | Hinshaw . |
| 4,853,828 | 8/1989 | Penn . |
| 4,907,124 | 3/1990 | Kaufman . |
| 4,916,575 | 4/1990 | Van Asten ......................... 361/386 |
| 4,961,125 | 10/1990 | Jordan et al. . |
| 4,972,294 | 11/1990 | Moses, Jr. et al. ................ 361/386 |
| 5,077,638 | 12/1991 | Andersson et al. . |
| 5,099,550 | 3/1992 | Beane et al. . |
| 5,109,318 | 4/1992 | Funari et al. . |

OTHER PUBLICATIONS

Donegan, "Thermal Connection For Circuit Package", IBM Technical Disclosure Bulletin, vol. 13, No. 7, Dec. 1970, p. 2029.

*Primary Examiner*—Gregory D. Thompson
*Attorney, Agent, or Firm*—Merchant, Gould, Smith, Edell, Welter & Schmidt

[57] ABSTRACT

A power supply assembly for converting input power into desired output power comprises a plurality of printed circuit boards each having oppositely facing front and back major surfaces. The back major surfaces of the first and second circuit boards are substantially devoid of the electrical components. The power supply assembly further includes a heat sink disposed adjacent to the first and the second circuit boards, an electrically conducting spline member, which is disposed between the first and second circuit boards, being attached to the heat sink, and a plurality of connectors electrically connecting the first and second circuit boards.

23 Claims, 10 Drawing Sheets

POWER SUPPLY ASSEMBLY

FIELD OF THE INVENTION

The present invention relates to a power supply assembly. More particularly, the present invention relates to a power supply assembly having a sandwich-like configuration with two circuit boards being positioned back-to-back and a spline member being disposed therebetween, and a heat transferring apparatus for dissipating heat from the circuit boards to a heat sink mounted on an edge of the spline member.

BACKGROUND OF THE INVENTION

A power supply is the power source for many electrical systems, such as communication network systems, computer main frames, etc. which have power requirements which are not satisfied by standard Alternating Current (AC) and/or Direct Current (DC) sources. The power supply may derive their electrical current standard AC sources such as conventional utility power and/or from DC sources such as batteries. The power supply then massages the current to produce the required power output.

A power supply is often the largest portion in an electrical system, and is often the most space-consuming portion in the electrical system as well. Therefore, achieving a small package configuration is an important consideration for design purposes.

Another concern in designing a power supply is the ventilation of the power supply. Most of the electrical elements or components on a power supply are heat producers. Heat has an impart on the reliability of performance and efficiency of the power supply. In order to maintain temperatures in the power supply at a desired level, it is often necessary to transfer heat from the heat generating components to a heat dissipative body, such as a heat sink, etc.

U.S. Pat. No. 4,707,726 issued to Tinder discloses an arrangement for mounting a packaged semiconductor with a heat sink having a channel formed therein. The semiconductor package is positioned within the heat sink channel and is engaged by one or more spring beams which are interposed between one of the channel walls and the semiconductor package. Thus, Tinder provides a heat dissipating passage from the semiconductor package to the heat sink. In Tinder, the packaged semiconductor is typically preassembled to a printed circuit board prior to mounted assembly with the heat sink.

U.S. Pat. No. 4,193,444 issued to Boyd et al. discloses a mounting arrangement for thermal conduction. Boyd et al. provides a heat dissipating path from a U-shaped carrier element to a heat sink through a U-shaped support element. The support element is mounted on the heat sink. The carrier element is attached to the support member. Heat is dissipated from the heat generating electrical components, which are carried by the carrier element, to the heat sink.

U.S. Pat. No. 4,639,834 issued to Mayer discloses a power supply having a partition at a bottom of a housing subdividing the housing into first and second spaces, and two heat sinks dissipating heat generated from both spaces.

U.S. Pat. No. 5,077,638 issued to Andersson et al. discloses a heat sink intended for mounting along the edge of an electrical circuit board in order to cool heat generating components on the circuit board. The heat sink is designed with a longitudinal slot for mounting on the circuit board and a mounting flange located in substantially the same plane as the slot.

The present invention provides a power supply assembly which overcomes many of the disadvantages associated with such devices of this general type.

SUMMARY OF THE INVENTION

The present invention relates to an electrical component assembly such as a power supply assembly having a densely packed configuration and providing for efficient heat dissipation and transfer.

The present invention also relates to a clip apparatus for attaching electrical components to a heat sink.

In one embodiment, a first circuit board having oppositely facing front and back major surfaces and a second circuit board having oppositely facing front and back major surfaces are disclosed. A spline member having oppositely facing major surfaces is disposed intermediate of the first and the second circuit boards with the oppositely facing major surfaces of the spline member facing the back major surfaces of the first and second circuit boards so as to form a sandwich-like configuration with the first and second circuit boards being positioned back-to-back and the spline member being disposed therebetween. One advantage of the sandwich-like configuration in the present invention is to dramatically reduce the size of the power supply assembly. Another advantage of this configuration is to relieve the electrical coupling between individual electrical components when the individual electrical components are densely packed.

Still in one embodiment, an edge of the spline member is mounted to a heat sink. One of the advantages of this configuration is to further reduce the size of the power supply assembly and form a simple heat transferring and dissipating path between the heat sink and the first and second circuit boards.

In one embodiment, a plastic clip compresses selected electrical components or packages onto the heat sink so that the heat is transferred from the electrical components to the heat sink. In addition, an electrically insulative thermally conductive layer is disposed on the heat sink so that the heat sink and the electrical components are electrically insulated from each other. One of the advantages of this configuration is that it provides a simple and safe heat transferring and dissipating path.

Further, in one embodiment, the first and second circuit boards, the heat sink and the spline member are positioned in a power supply assembly housing. The first and second circuit boards, the spline member and the housing are aligned to each other by using a mechanical alignment mechanism. In a preferred embodiment, at least two alignment holes are disposed in each the housing, the first and second circuit boards and the spline member. An elongated member inserted through the alignment holes to verify proper alignment of the alignment holes.

These and various other advantages and features of novelty which characterize the invention are pointed out with particularity in the claims annexed hereto and forming a part hereof. However, for a better understanding of the invention, its advantages, and objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

In the drawings, in which like reference numerals and letters generally indicate corresponding parts throughout the several views.

DETAILED DESCRIPTION OF THE PREFERRED EMBODIMENT

Figure 1:
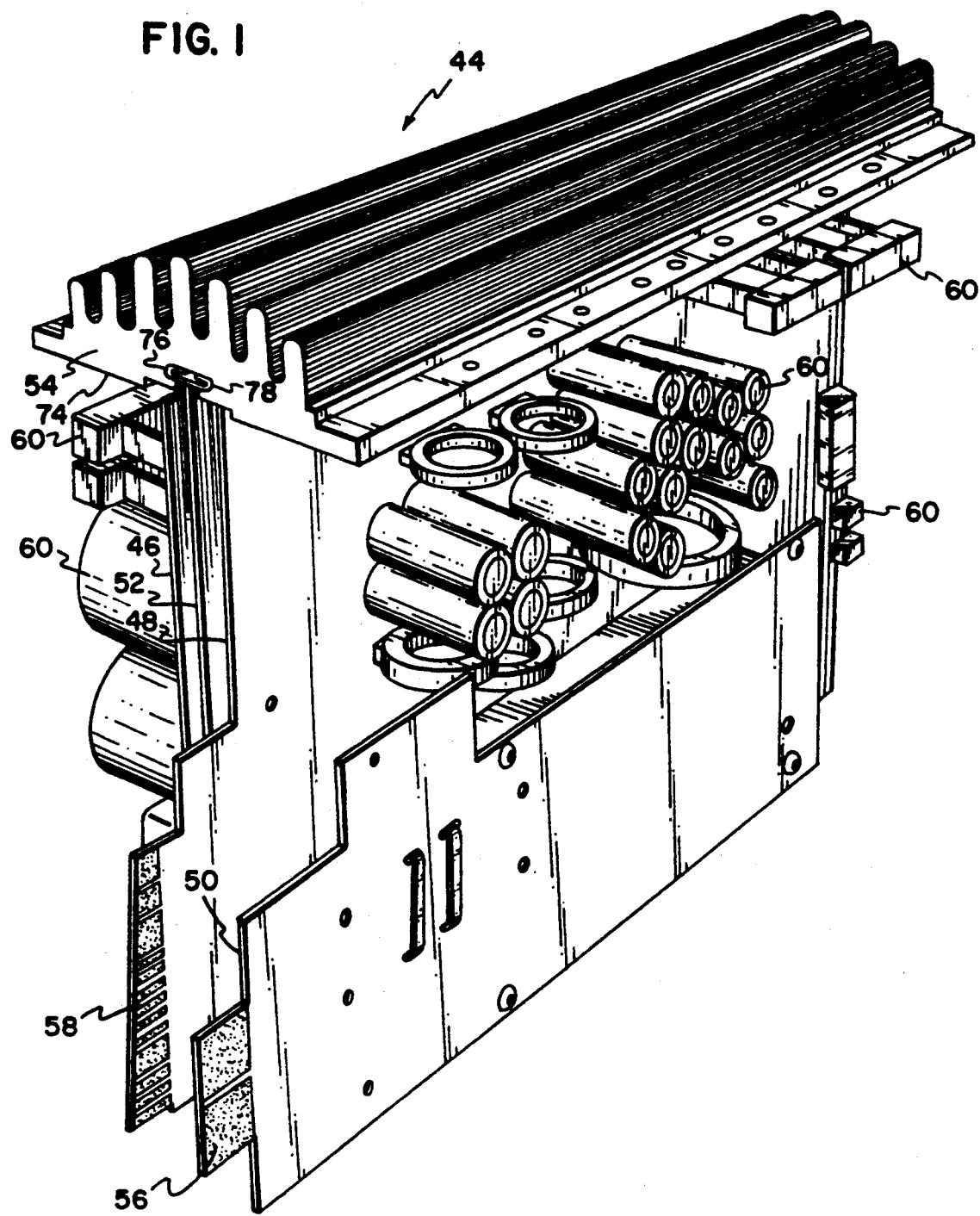
FIG. 1 is a perspective view of an embodiment of a power supply in accordance with the principles of the present invention having first, second and third circuit boards, a spline member and a heat sink.

Referring to FIG. 1, there is shown an embodiment of a power supply in accordance with the principles of the present invention. The power supply body 44 includes a first circuit board 46, a second circuit board 48, a third circuit board 50, a spline member 52 and a heat sink 54.

The spline member 52 is slidably inserted into a longitudinal notch 76 which is disposed on an inner surface 74 of the heat sink 54. A C-shaped edge 78 of the spline member 52 is frictionally slid into the notch 76 on the inner surface 74, and attached to the spline member 52 by welding or the like at one end of the heat sink. The spline member 52 is disposed substantially perpendicular to the heat sink 54. The spline member 52 has oppositely facing major surfaces.

The first circuit board 46, which has oppositely facing front and back major surfaces, is mounted on the spline member 52 wherein the back major surface of the first circuit board 46 and one of the major surfaces of the spline member 52 are facing each other. Electrical components 60 in the power supply body 44 are disposed on the front major surface of the first circuit board 46 facing away from the spline member 52.

The second circuit board 48, which has oppositely facing front and back major surfaces, is mounted on the spline member 52 wherein the back major surface of the second circuit board 48 and the other major surface of the spline member 52 are facing each other. Electrical components 60 are disposed on the front surface of the second circuit board 48 facing away from the spline member 52. Accordingly, the first circuit board 46 and the second circuit board 48 are mounted back-to-back with the spline member 52 disposed therebetween.

In the preferred embodiment, the electrical components are separated into two groups wherein one group of electrical components 60 has generally high interference characteristics, such as transformers, capacitors, circuit breakers, etc. The other group of electrical components 60 includes generally lower interference characteristics so that the spline member 52 separates the two groups of electrical components to reduce the interference between the electrical components. In the embodiment shown, the electrical components having higher interference characters are disposed on the first circuit board 46 and the electrical components 60 having lower interference characters are disposed on the second circuit board 48.

Still referring to FIG. 1, a third circuit board 50 is mounted on a pair of support standings 80 so that the second and the third circuit boards are parallel to each other. A DC current input port 56 is disposed at one end of the third circuit board 50. The input port 56 might be interconnected to terminals from a DC battery (not shown). The third circuit board 50 is usually called a power supply input board. A communication and power supply output port 58 is disposed at one end of the second circuit board 48. The power supply might provide a plurality of power outputs so as to satisfy the various types of power requirements associated with the electrical system with which it is being used. The second circuit board 48 is usually called the power supply output board.

Figure 2:
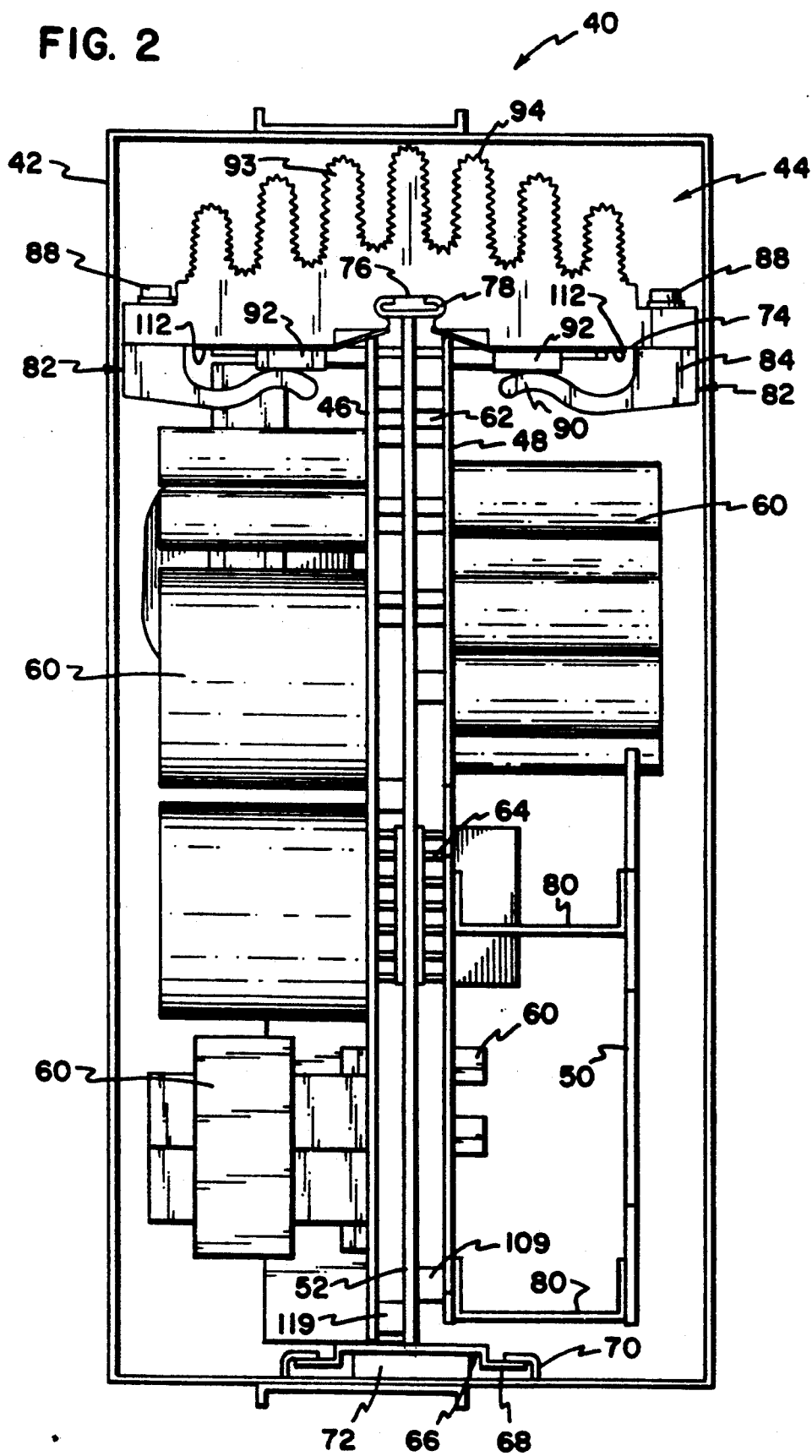
FIG. 2 is an end view of the power supply shown in FIG. 1 disposed within a housing.

Now referring to FIG. 2, a power supply assembly 40 having the power supply 44 disposed in a housing 42 is shown. In the preferred embodiment, the power supply body 44 is slidably inserted into the housing 42. One edge of the spline member 52 away from the heat sink 54, has suitably attached thereto a first flange 66 with two lower shoulders 68 extending from the flange 66. The lower shoulders 68 are slid underneath two L-shaped standings 70 and along a direction perpendicular to an opening of the housing 42. An adjusting spring 72 is inserted between the bottom side of the housing 42 and the flange 66 to vertically spring bias the power supply 44 relative to the housing 42. The horizontally relative position between the housing 42 and the power supply 44 is adjusted by sliding the shoulders 68 relative to the L-shaped standings 70.

Referring now to FIG. 2, there is shown a standoff 62 which is disposed between the first and second circuit boards 46, 48. The standoff 62 transfers a large current from the first circuit board 46 to the second circuit board 48. Additionally, a multi-leg connector 64 is disposed between the first and second circuit boards 46, 48. The multi-leg connector 64 transfers small current from the first circuit board 46 to the second circuit board 48. In the preferred embodiment, with the exception of the standoffs 62 and one multi-leg 64, there is no other connection between the first circuit board 46 and the second circuit board 48 so that there are no further power dissipations during the current transfer from the first circuit board 46 to the second circuit board 48. The power supply 44 shown is a DC power supply obtaining its input power from a battery or other source of DC power. In an AC power supply, the standoffs 62 might be replaced by a second multi-leg connector 64.

Further in FIG. 2, an electrical heat transferring package 92 is shown releaseably attached to the heat sink 54 at one end and to either first circuit board 46 or the second circuit board 48 at the other end so as to transfer heat from the first and second circuit boards 46, 48 to the heat sink 54. The electrical heat transferring package 92 transfers heat from the first and second circuit boards 46, 48 to the heat sink 54, respectively. The electrical heat transferring package 92 might be any electrical component such as a thermistor, etc., which gives off a substantial amount of heat. A clip 82, having a head portion 84 mounted on the heat sink 54 by a screw 88, attaches a spring biased leg portion 90 to the electrical heat transferring package 92. The attachment between the spring biased leg portion 90 and the electrical heat transferring package 92 enhances the attachment between the electrical heat transferring package 92 and the heat sink 54 so as to provide a good heat transfer pathway between the first and second circuit boards 46, 48 to the heat sink 54. Further, the heat sink 54 is provided along its outer surface with a number of longitudinal cooling flanges 93. In the preferred embodiment, the heat sink 54 is fluted so as to include seven cooling flanges 93 so that the heat transferring surfaces of the heat sink 54 have a greater surface area which results in more effective cooling. There are a plurality of fins 94 disposed on the surface of the cooling flanges 93 of the heat sink 54 to further increase the area of the heat transferring surface.

Figure 3:
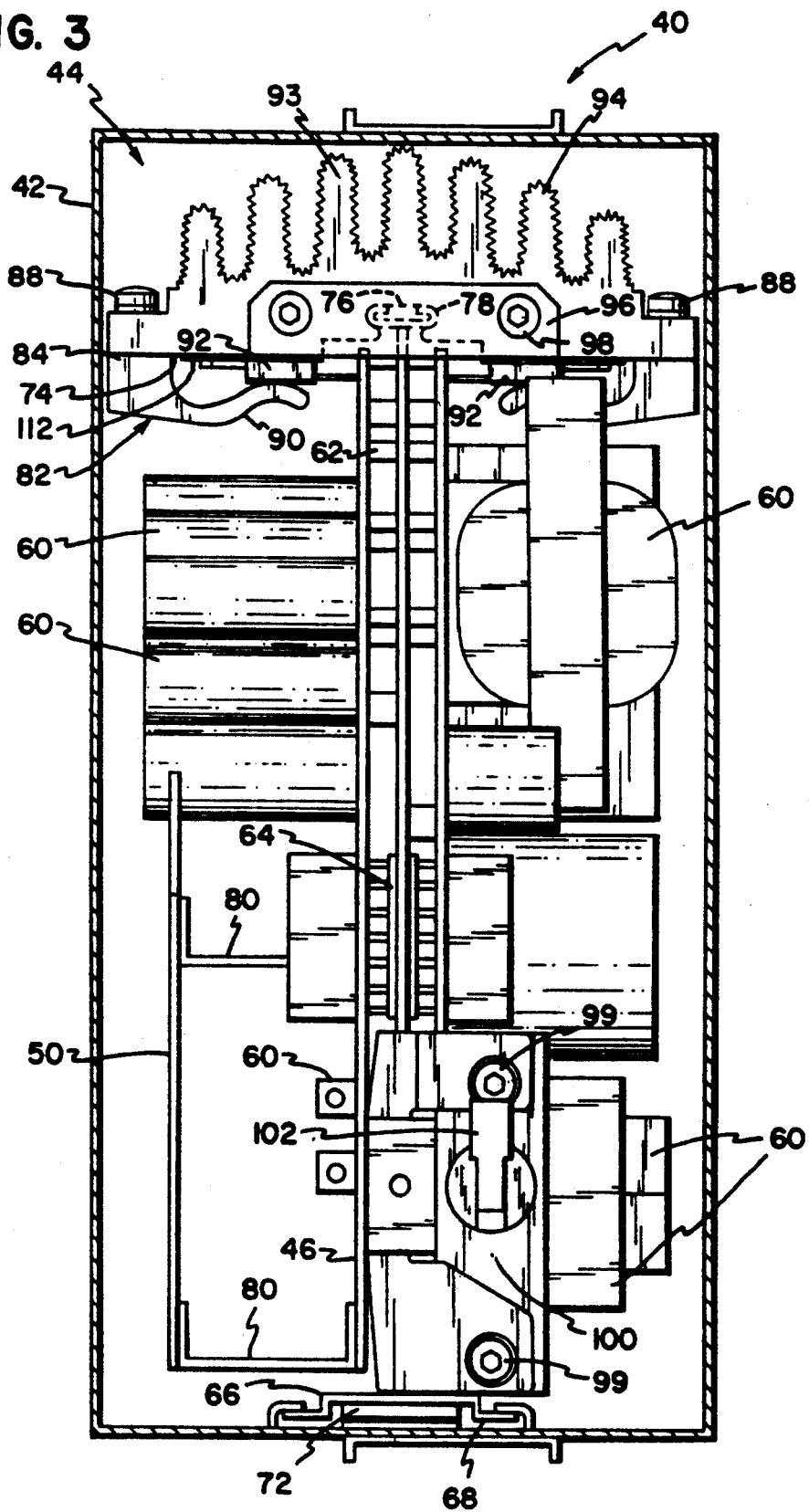
FIG. 3 is an opposite end view of the power supply shown in FIG. 1, disposed within a housing.

Referring now to FIG. 3, the opposite end view of the power supply assembly 40 having a power supply body 44 disposed in the housing 42 is shown. The edge 78 of the spline member 52 which is slidably inserted into the notch 76 of the heat sink 54 is soldered to a metal pad 96 at the end of the heat sink 54. The metal pad 96 is further mounted on the heat sink 54 by two mounting screws 98 so that the heat sink 54 and the spline member 52 are fixedly attached together.

A circuit breaker 100 is positioned in a first notch 140 of the first circuit board 46 and is mounted on the spline member 52 by two screw members 99. A manual on/off switch 102 is disposed at one end of the circuit breaker 100. The circuit breaker 100 is controlled by the manual on/off switch 102. Various types of circuit breakers can be used in the power supply assembly 40. In the preferred embodiment, an AIRPAX ® circuit breaker is used to control the power supply.

Figure 4:
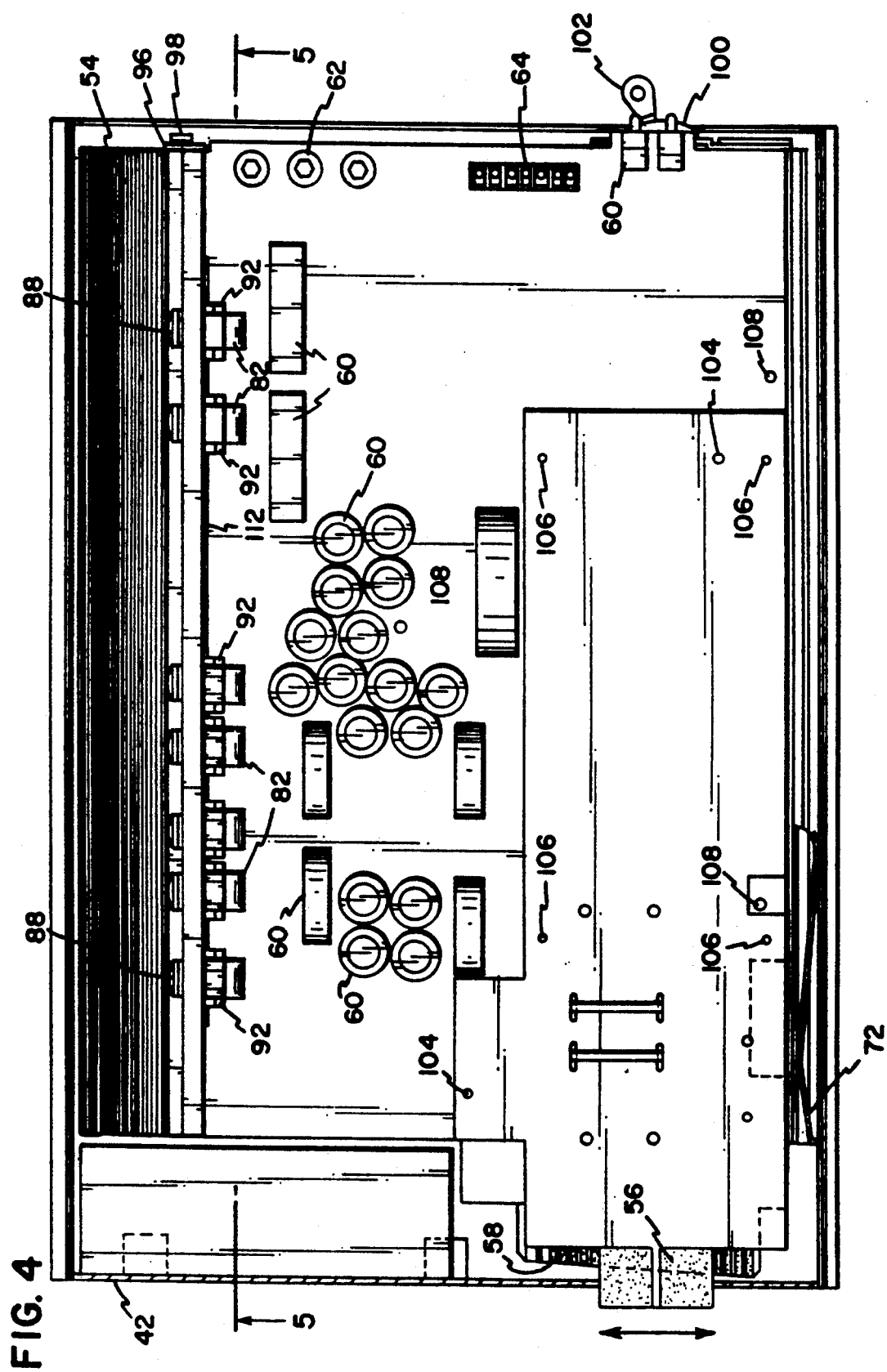
FIG. 4 is a plan view of one side of the power supply shown in FIG. 1.

Now referring to FIG. 4, a plan view of the side of the power supply 44 including the second circuit board 48 and the third circuit board 50 and being disposed in the housing 42, is shown. The heat sink 54 is positioned at the top of the housing 42, and the third circuit board 50 is positioned approximate the bottom portion of the housing 42. The adjusting spring 72 is positioned underneath the power supply body 44 to adjust the relative vertical position between the housing 42 and the power supply 44.

Figure 8A:
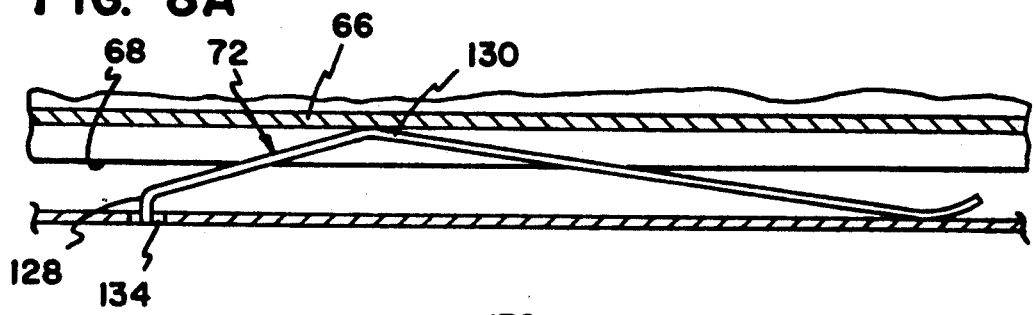
FIG. 8A is an enlarged view of an adjusting spring sliding between a bottom surface of the housing and the spline of the power supply.
Figure 8B:
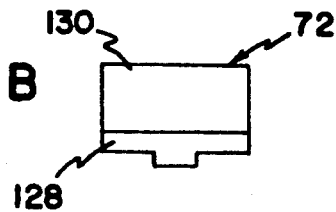
FIG. 8B is an enlarged end view of the adjusting spring so as to be more clearly shown.

An enlarged view of the adjusting spring 72 and its position underneath the power supply 44 is shown in FIG. 8A. The adjusting spring 72 comprises a head stop portion 128, a middle supporting portion 130 and a leg biasing portion 132 wherein the head stop portion 128 is attached to the bottom side of the housing 42, the middle supporting portion 130 supports the power supply 44 and the leg biasing portion 132 rests on the bottom side of the housing 42. The position of the middle supporting portion 130 biases against the power supply 44 so as to allow adjustment of the relative vertical position between the power supply 44 and the housing 42. It is preferable that the leg biasing portion 132 is longer than the head stop portion 128. Various kinds of biasing springs can be used as the adjusting spring 72 in this invention. In this preferred embodiment, a metal biasing spring is used. A notch 134 which receives the head stop portion 128 is disposed at the bottom surface of the housing 42. The position of the notch 134 which stops the further movement of the adjusting spring 72 is predeterminably designed. FIG. 8B shows an enlarged view of the notch 134 at the bottom surface of the housing 42.

In FIG. 4, the circuit breaker 100 and the on/off switch 102 (both are underneath the second circuit board 48) is shown projected from a front end of the housing 42. The input port 56 on the third circuit board 50 and the output port 58 on the second circuit board 48 are disposed at a back end of the housing 42.

Further, in FIG. 4, the three stand-offs 62 and one multi-leg 64 are disposed between the first and the second circuit boards 46, 48 at the front end of the housing 42. A plurality of clips 82 which are firmly attached to a plurality of electrical heat transferring packages 92 are mounted on the heat sink 54.

Figure 5:
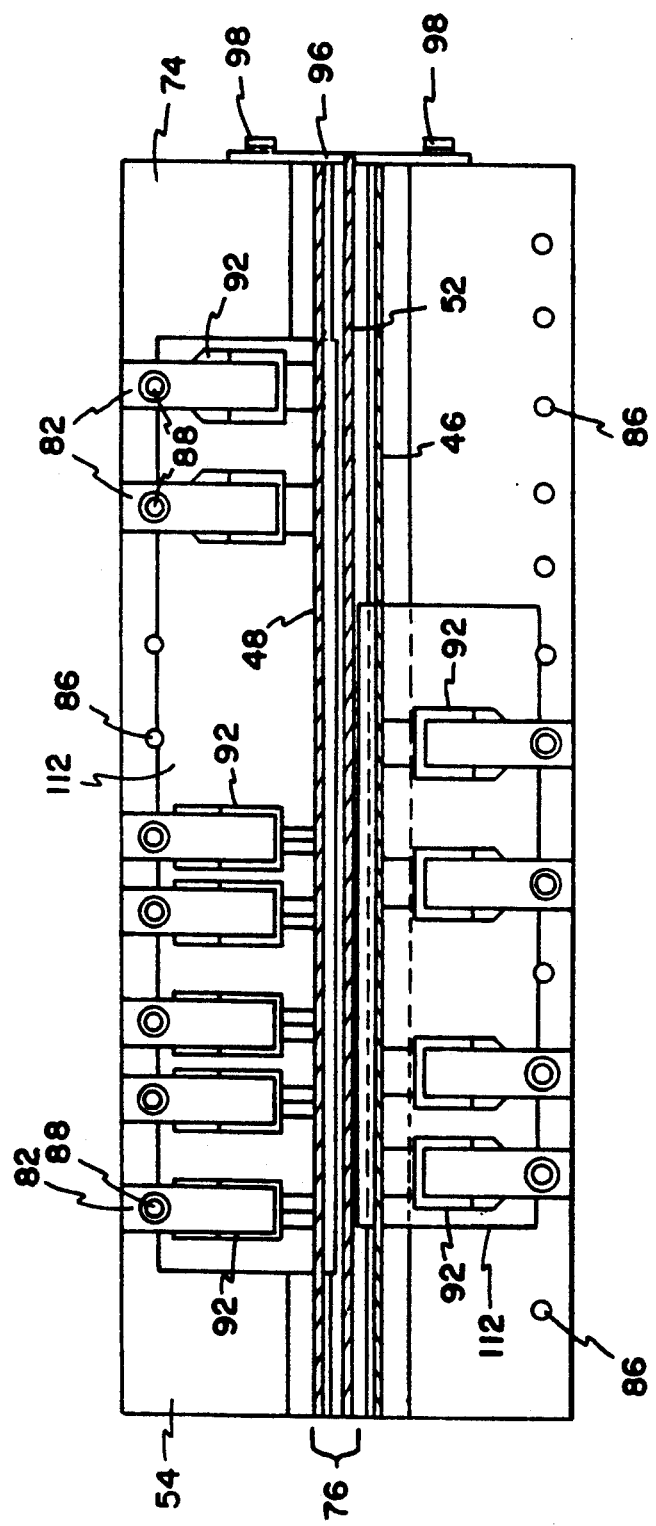
FIG. 5 is a bottom plan view of the heat sink and the power supply with the electrical components removed from the circuit boards for purposes of illustration, and is viewed generally along line 5—5 of FIG. 4.

Now referring to FIG. 5, a bottom plan view of the heat sink 54 as generally viewed along the line 5—5 of FIG. 5 is shown. A plurality of the electrical heat transferring packages 92 are electrically mounted on the first and second circuit boards 46, 48 by soldering or the like. The heat transferring packages 92 are firmly attached to the inner surface 74 of the heat sink 54 by the clip 82 and the screw 88. Therefore, the heat generated from the first and second circuit boards 46, 48 is transferred to the heat sink 54 through the electrical heat transferring package 92. The clip 82 is made of electrical insulating material such as a polymer material so that there is no current dissipated from the electrical heat transferring package 92 to the heat sink 54 through the clip 82. An electrically insulating layer 112 is positioned between the electrical heat transferring package 92 and the inner surface 74 of the heat sink 54. The insulating layer 112 is made of an electra-insulating and heat conductive material so that there is no current dissipated from the electrical heat transferring package 92 to the heat sink 54 through the electrical heat transferring package 92. One example of material which might be used is ULTEM ™, a polyetherimide A row of holes 86 is respectively disposed at the edge of the heat sink 54 through which the clip is mounted by the screw 88.

Figure 6:
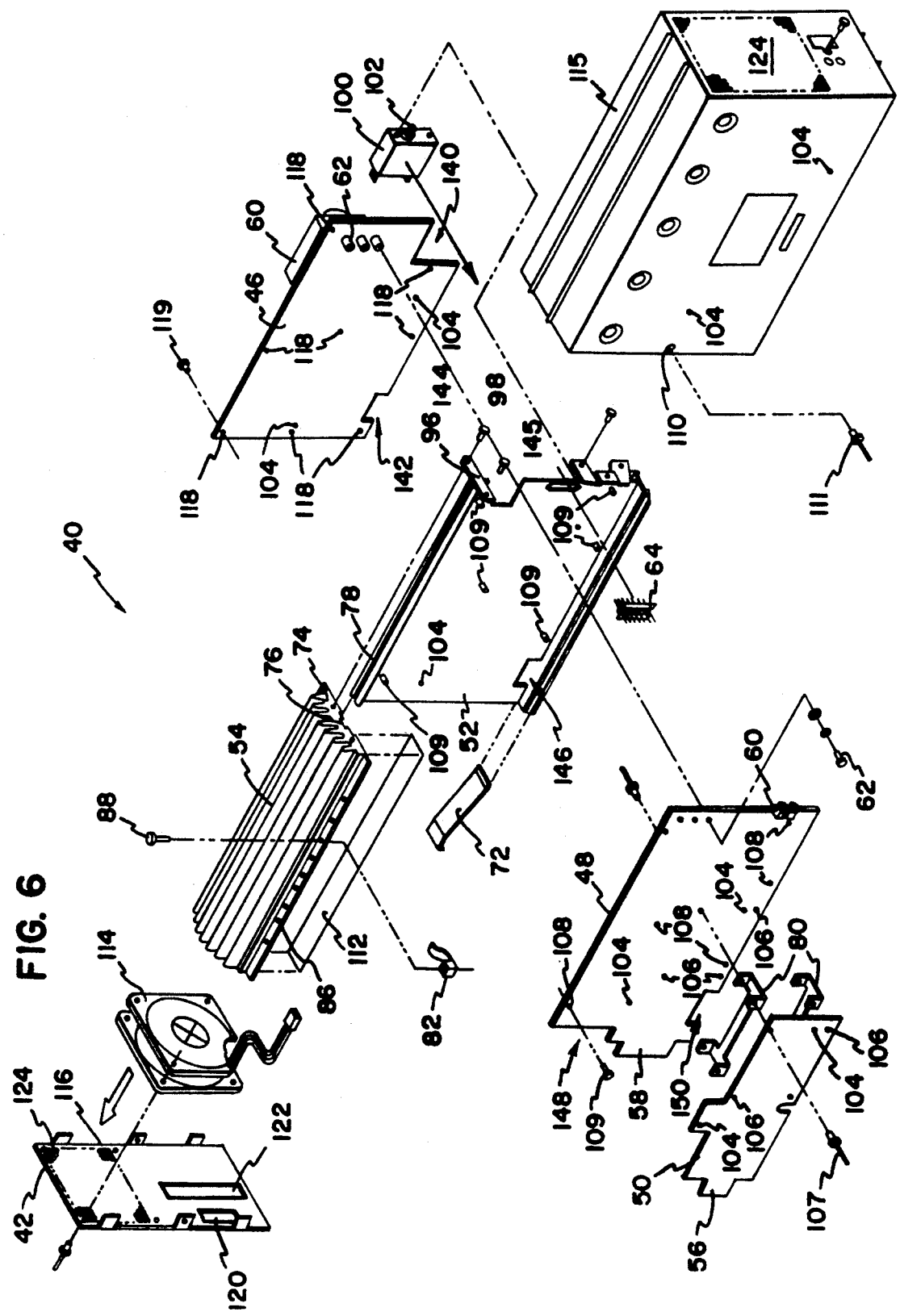
FIG. 6 is an exploded view of the power supply assembly.
Figure 7:
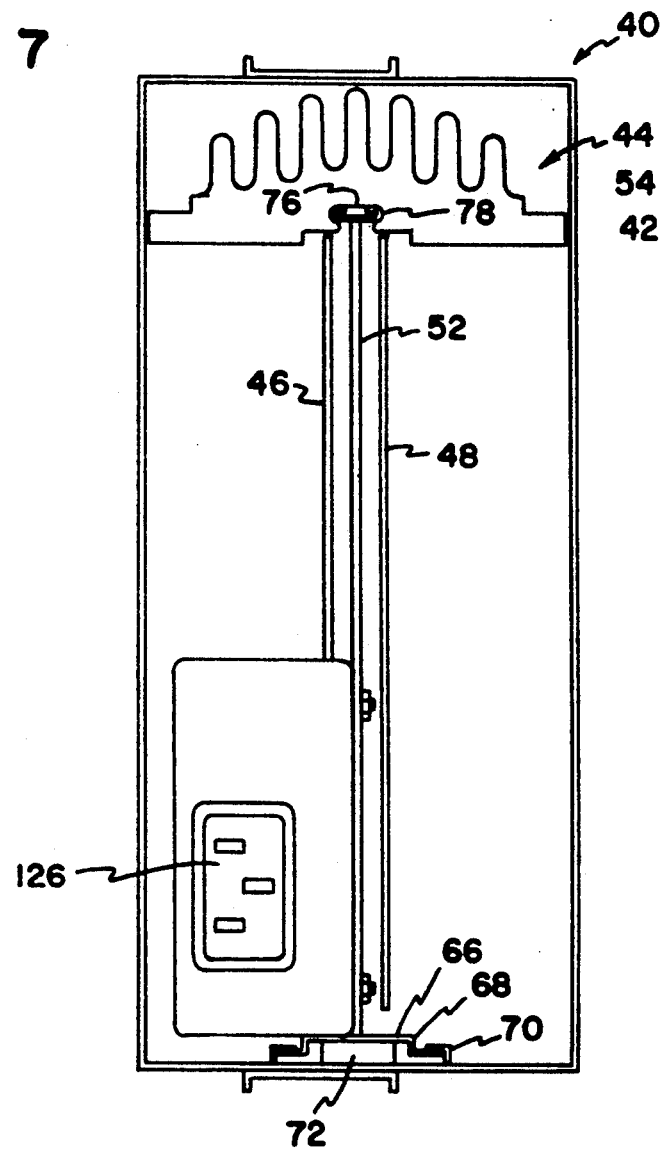
FIG. 7 is the end view generally shown in FIG. 2 including an output panel and having the electrical components removed from the circuit boards.

Referring to FIG. 6, there is shown an exploded view of the power supply assembly 40. The housing 42 is separated into a housing body 115 and a door 116. An electrical fan 114 disposed between the door 116 and the power supply 44 is used to withdraw heat from the heat sink 54 and to transfer the heat, through the door 116, to the outside of the power supply assembly 40. An input port opening 120 and an output port opening 122 disposed on the door 116, respectively, receive the input port 56 on the third circuit board 50 and the output port 58 on the second circuit board 48. In FIG. 7, an output panel 126 is shown which is received in output port 58 extended from the output port opening 122.

Referring to FIG. 6, the supports 80 connect the second circuit board 48 and the third circuit board 50 by mounting a screw 107 into holes 106 disposed on the second and third circuit boards 48, 50 and the supports 80. In the preferred embodiment, there are four sets of holes 106 being used.

The second circuit board 48 is connected to the spline member 52 by mounting a screw 109 through a mounting hole 108 disposed on the second circuit board 48 and the spline member 52. In the preferred embodiment, six sets of mounting holes 108 are used. The first circuit board 46 is connected to the spline member 52 by screws 119 passing through holes 118 which are respectively disposed on the first circuit board 46 and the spline member 52. In the preferred embodiment, eight sets of holes 118 are used. A first notch 140 on the first circuit board 46 receives the circuit breaker 100 which is mounted on the spline member 52. A first notch 144 on the spline member 52 receives the standoffs 62 which connect the first and second circuit boards 46, 48. A second notch 145 fixedly receives the multi-leg connector 64 which connects the first and second circuit boards 46, 48. A first notch 148 on the second circuit board 48 receives the electrical fan 114 which is disposed between the door 116 of the housing 42 and the power supply body 44. A second notch 142 on the first circuit board 46, a third notch 146 on the spline member 52 and a second notch 150 on the second circuit board 48, which are aligned to each other, receives an electrical wire (not shown) from the third circuit board 50 to the first circuit board 46 which conducts DC input to the primary electronics of the first circuit board 46. The heat sink 54 is slidably attached to an edge of the spline member 52 and is further mounted on the spline member 52 by the mounting pad 96 and the mounting screw 98 so that the power supply body 44 is formed. The power supply 44 is received in the housing 42 by sliding the power supply 44 along the L-shaped standings 70 at the bottom surface or the housing 42.

Figure 9A:
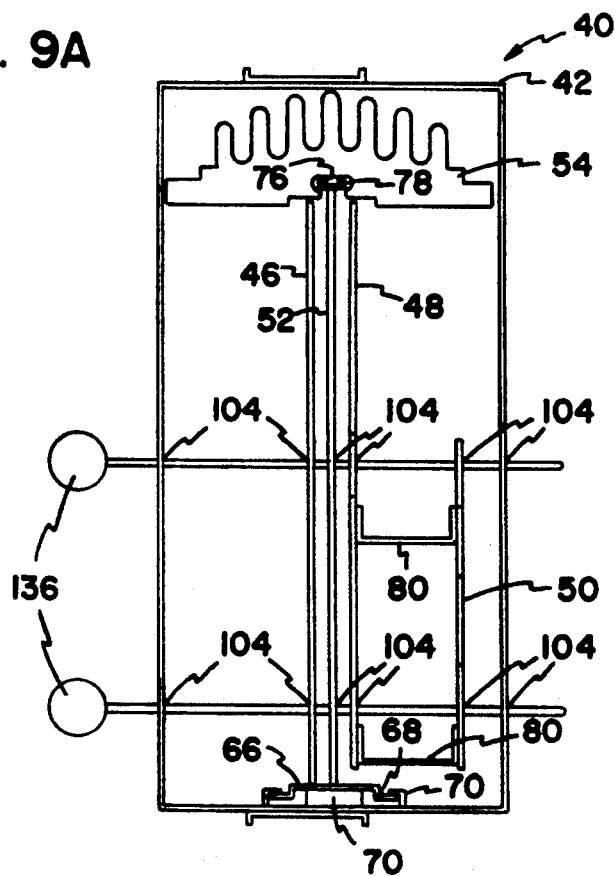
FIG. 9A is a diagrammatic view of the housing and the power supply body aligned with each other.
Figure 9B:
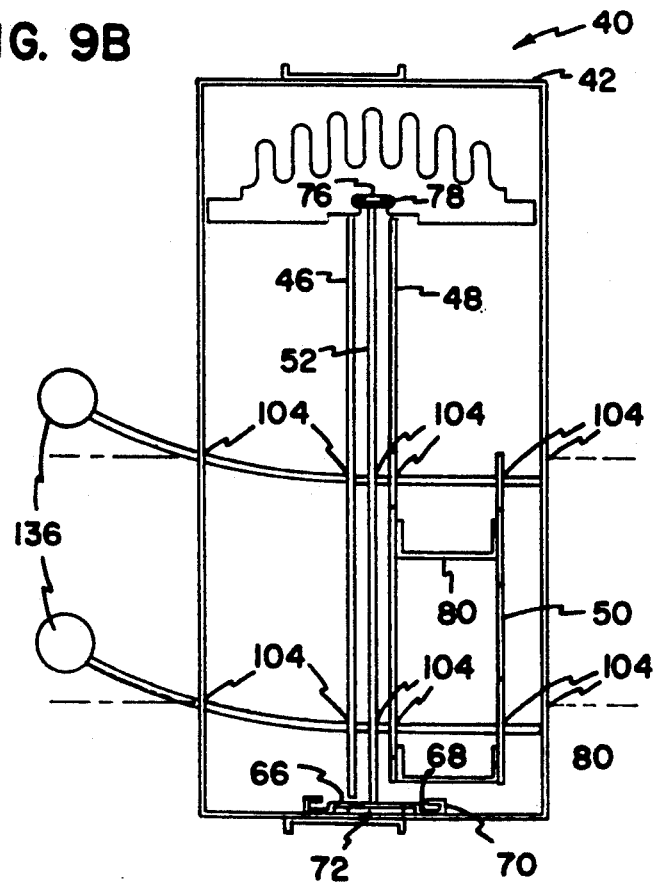
FIG. 9B is a view of the housing and the power supply body disaligned with each other.

An alignment hole 104 is respectively disposed on the first circuit board 46, the spline member 52, the second circuit board 48, the third circuit board 50 and the housing 42. In the preferred embodiment, two alignment holes 104 are used to test the alignment between the housing 52 and the power supply 44 by a pin 136 being inserted into the alignment hole 104. The adjusting spring 72 is then inserted underneath the power supply 44 to adjust the alignment between the housing 42 and the power supply 44. FIG. 9A shows the housing 42 and the power supply 44 aligned to each other. The alignment is tested by inserting an elongated member 136 through the alignment holes 104. FIG. 9B shows a disalignment between the housing 42 and the power supply 44. At this time, the pin 136 is bent and cannot go through the alignment hole 104 on the other side of the housing 42. Therefore, the adjusting spring 72 is used to adjust to the relative position between the housing 42 and the power supply 44.

Figure 10A:
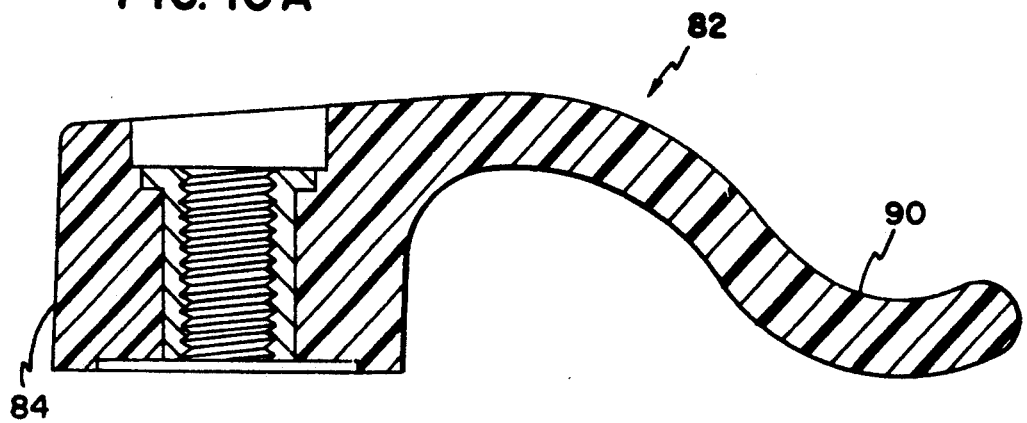
FIG. 10A is an enlarged view of one embodiment of a clip in accordance with the principles of the present invention.
Figure 10B:
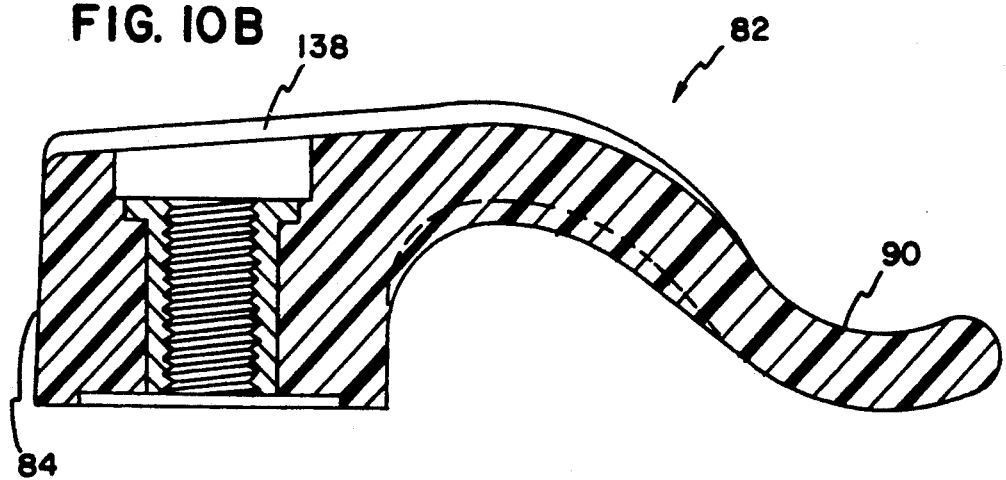
FIG. 10B is an enlarged view of an alternative embodiment of the clip.

Now referring to FIG. 10A, an enlarged view of the clip 82 is shown. The head portion 84 of the clip 82 includes a hole which is aligned to one of the holes 86 of the heat sink 54 for mounting on the heat sink 54 by use of the screw 88 passing through the hole 86 of the clip 82 and the heat sink 54. The spring biased portion 90 of the clip 82 is extended from the head portion 84 and attached to the electrical heat transferring package 92. The clip 82 is made of a resilient plastic material so as to firmly attach the electrical heat transferring package 92 to the heat sink 54. FIG. 10B shows an alternative embodiment of the clip 82. A spine rib 138 which is connected the head portion 84 and the spring biased portion 90 enhances the resilience of the clip 82 so as to firmly attach the electrical heat transferring package 92 to the heat sink 54.

Figure 11:
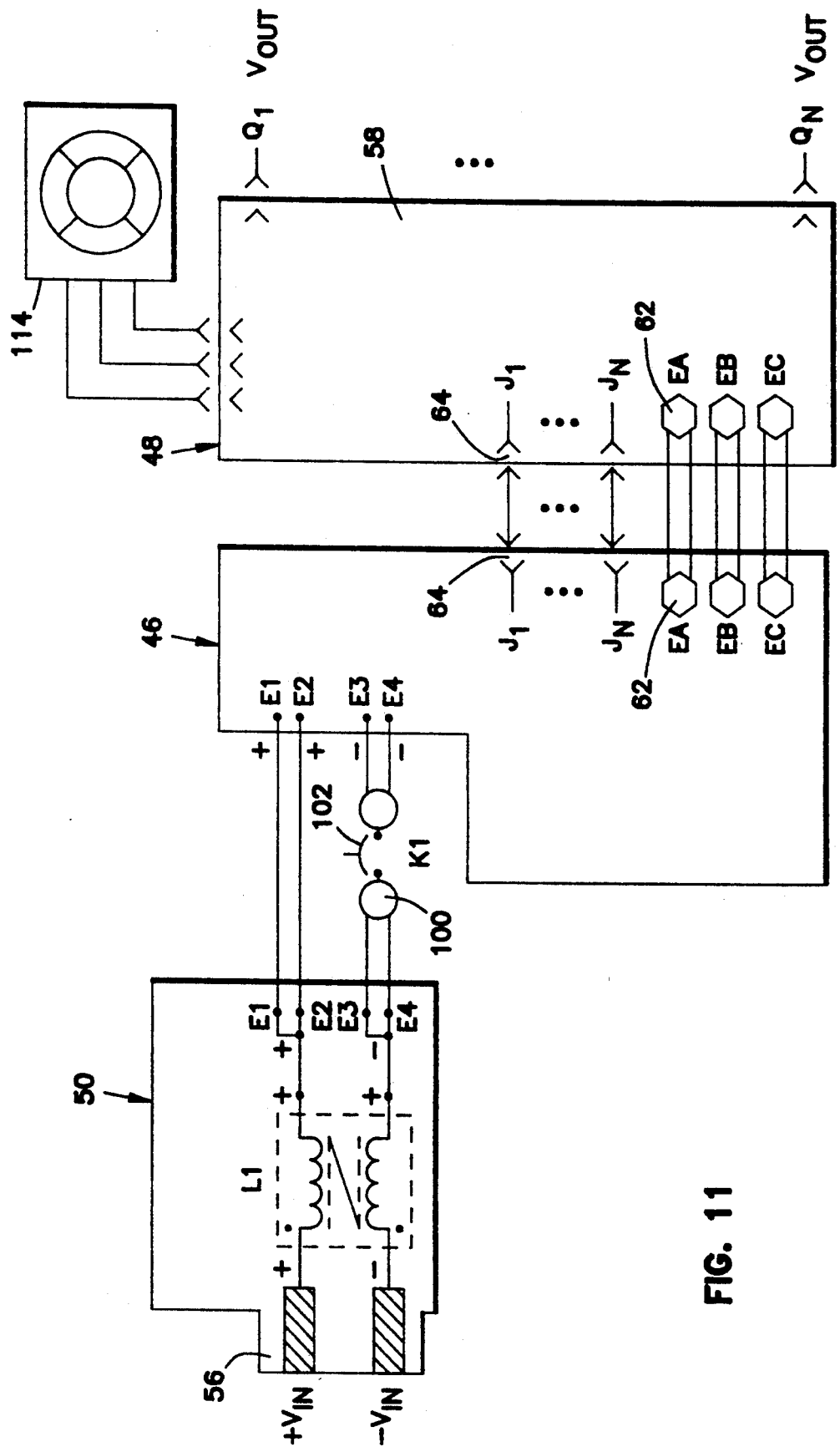
FIG. 11 is a block diagram of the power supply.

Now referring to FIG. 11, a schematic circuit block diagram of the power supply assembly 40 is shown. The third circuit board 50 receives an AC current from outside at the input port 56. The DC current is transferred to the first circuit board 46 which has the primary electronics. Then, the higher currents are transferred to the secondary electronics of the second circuit board 48 by the standoffs 62 (EA, EB, EC) and the lower currents are transferred by the multi-leg connector 64 (J1 ... JN). Thereafter, the power supply output is provided to a plurality of outputs (Q1 ... QN) which are disposed at the output port 58 of the second circuit board 48. The electrical fan 114 absorbs the heat generated by electrical components 60 from the first and second circuit boards 46, 48 to the outside through the heat sink 54.

It is to be understood, however, that even though numerous characteristics and advantages of the present invention have been set forth in foregoing description, together with details of the structure and the function of the invention, the disclosure is illustrative only, and the changes may be made in detail, especially in matters of shape, size and arrangement of parts within the principles of the invention to the full extent indicated by the broad general meaning of the terms in which the appended claims are expressed.

What is claimed is:

1. A power supply assembly including electrical components for converting input power into desired output power, comprising:

a first circuit board having oppositely facing front and back major surfaces and a second circuit board having oppositely facing front and back major surfaces, the back major surfaces of the first and second circuit boards being substantially devoid of the electrical components, the front major surfaces of the first and second circuit boards containing most of the electrical components;

a heat sink disposed adjacent an edge of the first and the second circuit boards;

an electrically conducting spline member having oppositely facing major surfaces and attached at an edge to the heat sink;

the first and second circuit boards being mounted on the spline member with the back major surfaces of the first and second circuit boards facing one another and the spline member being disposed intermediate of the first and the second circuit boards with the oppositely facing major surfaces of the spline member facing the back major surfaces of the first and second circuit boards so as to form a sandwich-like configuration with the first and second circuit boards being positioned back-to-back and the spline member being disposed therebetween;

an output port of the power supply assembly being disposed on an edge of the second circuit board away from the heat sink; and electrical connection means for electrically connecting the first and second circuit boards.

2. A power supply assembly in accordance with claim 1, wherein the heat sink includes a convoluted outer surface portion facing generally away from the first and second printed circuit boards.

3. A power supply assembly in accordance with claim 1, wherein the heat sink has a longitudinally extending slot disposed therein.

4. A power assembly in accordance with claim 3, wherein the edge of the spline member includes means for providing an interference fit with the slot.

5. A power supply assembly in accordance with claim 1, wherein the electrical connection means includes a plurality of electrically conducting standoffs electrically connecting the first and second circuit boards.

6. A power supply assembly in accordance with claim 5, wherein the spline member includes a first notch, the standoffs passing from the first circuit board to the second circuit board through the first notch in the spline member.

7. A power supply assembly in accordance with claim 6, wherein the standoffs are electric conductors which transfer high currents between the first circuit board and the second circuit board.

8. A power supply assembly in accordance with claim 1, wherein the electrical connection means includes a multi-leg electrical conductor connecting the first and second circuit boards.

9. A power supply assembly in accordance with claim 8, wherein the spline member includes a second notch, the multi-leg connector passing from the first circuit board to the second circuit board through the second notch.

10. A power supply assembly in accordance with claim 9, wherein the multi-leg connector transfers low currents between the first and the second circuit boards.

11. A power supply assembly in accordance with claim 1, wherein the heat sink further comprises a first row of through holes positioned on a first horizontal edge of the heat sink, a second row of through holes positioned on a second horizontal edge of the heat sink.

12. A power supply assembly in accordance with claim 1, wherein the heat sink has a substantially flat edge facing the spline member and first and second circuit boards, the heat sink having a height greater than the spacing between the first and second circuit boards.

13. A power supply assembly in accordance with claim 1, wherein a plurality of electric heat transfer packages are connected to the first and the second circuit boards and are attached to the heat sink at opposite ends by clip means for biasing the heat transfer packages into contact with the heat sink.

14. A power supply assembly in accordance with claim 13, wherein, the clip means comprises a clip having a head portion mounted on the heat sink, and a spring-biased leg portion biasing its associated electric heat transfer package into the heat sink so as to allow heat to transfer from the first and second circuit boards to the heat sink.

15. A power supply assembly in accordance with claim 14, wherein an electrically insulative layer is attached to the heat sink and is disposed between the electric heat transfer packages and the heat sink.

16. A power supply assembly in accordance with claim 14, wherein the clip is made up of polymeric material.

17. A power supply assembly in accordance with claim 1, wherein the power supply assembly further comprises a housing, in which the first and the second circuit boards, the spline member and the heat sink are disposed, the housing including at least two alignment holes on front and back major surfaces.

18. A power supply assembly in accordance with claim 1, further comprising means for adjusting relative positions between the housing and the first and the second circuit boards.

19. A power supply assembly including electrical components for converting input power into desired output power, comprising:
a first circuit board having oppositely facing front and back major surfaces and a second circuit board having oppositely facing front and back major surfaces, the back major surfaces of the first and second circuit boards being substantially devoid of the electrical components, the front major surfaces of the first and second circuit boards containing most of the electrical components;
a heat sink disposed adjacent an edge of the first and the second circuit boards;
an electrically conducting spline member having oppositely facing major surfaces and attached at an edge to the heat sink;
the first and second circuit boards being mounted on the spline member with the back major surfaces of the first and second circuit boards facing one another and the spline member being disposed intermediate of the first and the second circuit boards with the oppositely facing major surfaces of the spline member facing the back major surfaces of the first and second circuit boards so as to form a sandwich-like configuration with the first and second circuit boards being positioned back-to-back and the spline member being disposed therebetween;
means for electrically connecting the first and second circuit boards; and
a plurality of electric heat transfer packages are connected to the first and the second circuit boards and are attached to the heat sink at opposite ends by clip means for biasing the heat transfer packages into contact with the heat sink.

20. A power supply assembly in accordance with claim 19, wherein the clip means comprises a clip having a head portion mounted on the heat sink, and a spring-biased leg portion biasing its associated electric heat transfer package into the heat sink so as to allow heat to transfer from the first and second circuit boards to the heat sink.

21. A power supply assembly including electrical components for converting input power into desired output power, comprising:
a first circuit board having oppositely facing front and back major surfaces and a second circuit board having oppositely facing front and back major surfaces, the back major surfaces of the first and second circuit boards being substantially devoid of the electrical components, the front major surfaces of the first and second circuit boards containing most of the electrical components;
a heat sink disposed adjacent an edge of the first and the second circuit boards;
an electrically conducting spline member having oppositely facing major surfaces and attached at an edge to the heat sink;
the first and second circuit boards being mounted on the spline member with the back major surfaces of the first and second circuit boards facing one another and the spline member being disposed intermediate of the first and the second circuit boards with the oppositely facing major surfaces of the spline member facing the back major surfaces of the first and second circuit boards so as to form a sandwich-like configuration with the first and second circuit boards being positioned back-to-back and the spline member being disposed therebetween;

a third circuit board having a major surface wherein electric components are disposed, the major surface facing toward the front major surface of the second circuit board;

an input port of the power supply assembly being disposed on the third circuit board;

an output port of the power supply assembly being disposed on the second circuit board;

the input and output ports being away from the heat sink; and means for electrically connecting the first and second circuit boards.

22. A power supply assembly including electrical components for converting input power into desired output power, comprising:

a first circuit board having oppositely facing front and back major surfaces and a second circuit board having oppositely facing front and back major surfaces, the back major surfaces of the first and second circuit boards being substantially devoid of the electrical components, the front major surfaces of the first and second circuit boards containing most of the electrical components;

a heat sink disposed adjacent an edge of the first and the second circuit boards;

an electrically conducting spline member having oppositely facing major surfaces and means for slidably attaching an edge of the spline member to a longitudinal slot of the heat sink;

the first and second circuit boards being mounted on the spline member with the back major surfaces of the first and second circuit boards facing one another and the spline member being disposed intermediate of the first and the second circuit boards with the oppositely facing major surfaces of the spline member facing the back major surfaces of the first and second circuit boards so as to form a sandwich-like configuration with the first and second circuit boards being positioned back-to-back and the spline member being disposed therebetween; and means for electrically connecting the first and second circuit boards.

23. A power supply assembly including electrical components for converting input power into desired output power, comprising:

a first circuit board having oppositely facing front and back major surfaces and a second circuit board having oppositely facing front and back major surfaces, the back major surfaces of the first and second circuit boards being substantially devoid of the electrical components, the front major surfaces of the first and second circuit boards containing most of the electrical components;

a heat sink disposed adjacent an edge of the first and the second circuit boards;

an electrically conducting spline member having oppositely facing major surfaces and attached at an edge to the heat sink;

the first and second circuit boards being mounted on the spline member with the back major surfaces of the first and second circuit boards facing one another and the spline member being disposed intermediate of the first and the second circuit boards with the oppositely facing major surfaces of the spline member facing the back major surfaces of the first and second circuit boards so as to form a sandwich-like configuration with the first and second circuit boards being positioned back-to-back and the spline member being disposed therebetween; and means for electrically connecting the first and second circuit boards, connecting means including a plurality of electrically conducting standoffs and a multi-leg electrical conductor which connect the first and second circuit boards.

* * * * *